(12) United States Patent
Xu et al.

(10) Patent No.: US 11,664,747 B2
(45) Date of Patent: May 30, 2023

(54) DRIVING CIRCUIT AND DRIVING METHOD

(71) Applicant: Silergy Semiconductor Technology (Hangzhou) LTD, Hangzhou (CN)

(72) Inventors: Zhiwei Xu, Hangzhou (CN); Chiqing Fang, Hangzhou (CN); Chen Zhao, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 183 days.

(21) Appl. No.: 17/338,871

(22) Filed: Jun. 4, 2021

(65) Prior Publication Data

US 2021/0384849 A1  Dec. 9, 2021

(30) Foreign Application Priority Data

Jun. 9, 2020  (CN) .......................... 202010515774.3

(51) Int. Cl.
  *H02N 2/06*   (2006.01)
  *H02M 3/158*  (2006.01)
  *H02M 3/335*  (2006.01)

(52) U.S. Cl.
  CPC ............ *H02N 2/062* (2013.01); *H02M 3/158* (2013.01); *H02M 3/33584* (2013.01)

(58) Field of Classification Search
  CPC ....... H02N 2/062; H02N 2/067; H02M 3/158; H02M 3/33584; H02M 3/33561; H02M 3/3374; H02M 3/1584; H02M 1/0048; Y02B 70/10; H01L 41/042
  See application file for complete search history.

(56) References Cited

U.S. PATENT DOCUMENTS

| 6,563,252 | B2 | 5/2003 | Schrod |
| 6,703,762 | B1 | 3/2004 | Okada |
| 7,455,051 | B2 * | 11/2008 | Gotzenberger ....... H01L 41/042 310/317 |
| 2014/0334192 | A1 * | 11/2014 | Meyer ............... H02M 3/33592 363/21.01 |

FOREIGN PATENT DOCUMENTS

CN   202867012 U   4/2013

* cited by examiner

*Primary Examiner* — Emily P Pham

(57) ABSTRACT

A driving circuit for driving a piezoelectric load, can include: a rechargeable power supply; a power stage circuit coupled between the rechargeable power supply and the piezoelectric load; where during a first operation interval of an operation period, the rechargeable power supply charges the piezoelectric load through the power stage circuit, such that a power supply voltage signal provided to the piezoelectric load in the first operation interval corresponds to a reference voltage in a first interval; and where during a second operation interval of the operation period, the piezoelectric load charges the rechargeable power supply through the power stage circuit, such that the power supply voltage signal in the second operation interval corresponds to the reference voltage in a second interval.

20 Claims, 19 Drawing Sheets

DRIVING CIRCUIT AND DRIVING METHOD

RELATED APPLICATIONS

This application claims the benefit of Chinese Patent Application No. 202010515774.3, filed on Jun. 9, 2020, which is incorporated herein by reference in its entirety.

FIELD OF THE INVENTION

The present invention generally relates to the field of power electronics, and more particularly to driving circuits and methods for driving a piezoelectric load.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
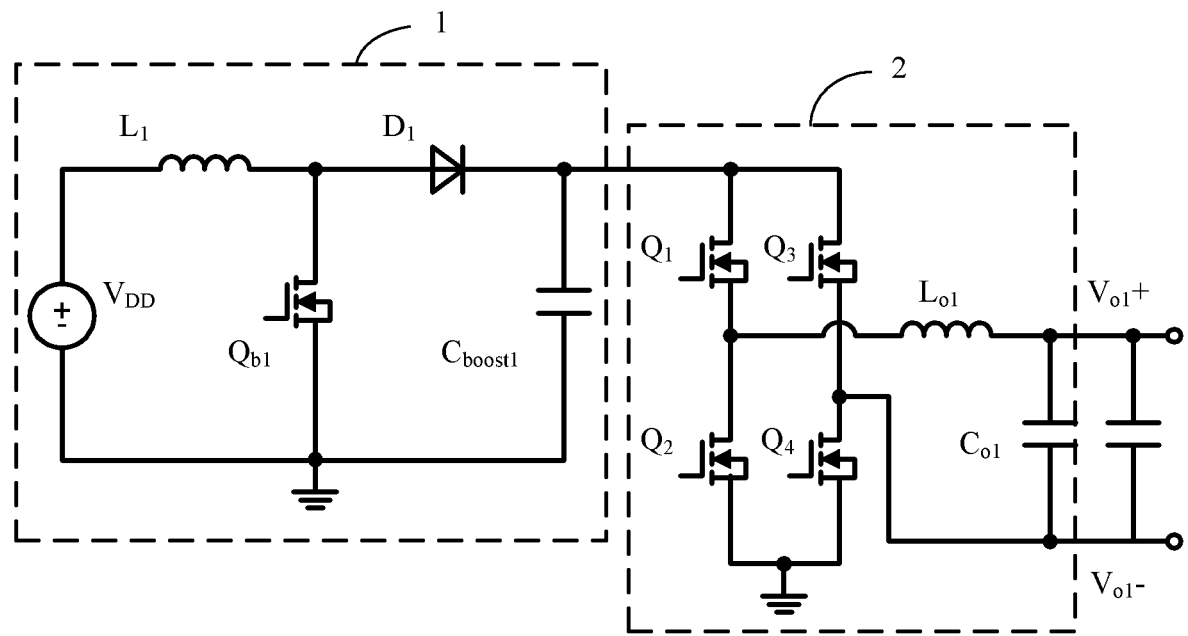
FIG. 1 is a schematic diagram of an example driving circuit.

As a piezoelectric load or a piezoelectric actuator, a piezoelectric ceramic is increasingly widely used. One example driving circuit for driving the piezoelectric ceramic is as shown in FIG. 1. This example driving circuit can include boost circuit 1 and full-bridge inverter circuit 2. Boost circuit 1 can convert input voltage VDD. Full-bridge inverter circuit 2 can convert direct current electricity output from boost circuit 1 into alternating current electricity, in order to drive piezoelectric ceramic $C_{load}$. This example driving circuit may require a large number of switches when driving one piezoelectric ceramic, and more switches when driving multiple piezoelectric ceramics coupled to respective full-bridge inverter circuits 2, which may not accommodate circuit integration.

Figure 2:
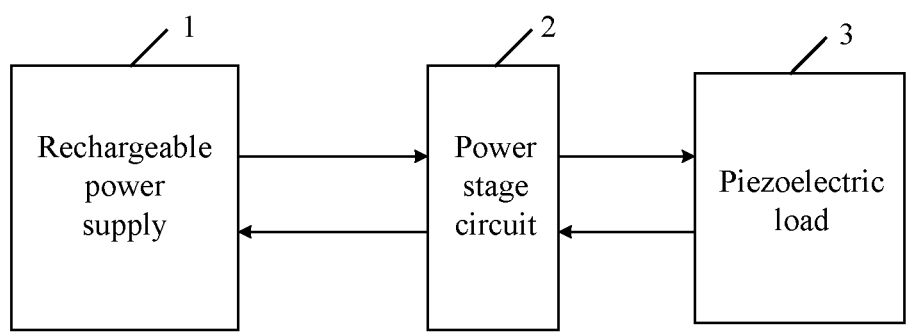
FIG. 2 is a block diagram of an example driving circuit, in accordance with embodiments of the present invention.

Referring now to FIG. 2, shown is a block diagram of a driving circuit, in accordance with embodiments of the present invention. In this particular example, the driving circuit used to drive piezoelectric load 3 can include rechargeable power supply 1 and power stage circuit 2. Power stage circuit 2 can be coupled between rechargeable power supply 1 and piezoelectric load 3. During a first operation interval of an operation period, rechargeable power supply 1 can charge piezoelectric load 3 through power stage circuit 2, such that a power supply voltage signal provided to piezoelectric load 3 in the first operation interval corresponds to a reference voltage in a first interval. During a second operation interval of the operation period, piezoelectric load 3 can charge rechargeable power supply 1 through power stage circuit 2, such that the power supply voltage signal in the second operation interval corresponds to the reference voltage in a second interval.

Power stage circuit 2 can be configured as a bidirectional converter (e.g., a bidirectional boost-buck converter, a bidirectional buck-boost converter, a bidirectional Cuk converter, a bidirectional Zeta-Sepic converter, a bidirectional flyback converter, a bidirectional forward converter, a bidirectional push-pull converter, a bidirectional half-bridge converter, a bidirectional full-bridge converter, etc.). The operation states of power stage circuit 2 can be controlled such that the power supply voltage signal in the first operation interval corresponds to the reference voltage in the first interval, and the power supply voltage signal in the second operation interval corresponds to the reference voltage in the second interval.

For example, during the first operation interval, power stage circuit 2 can be controlled to operate in a forward direction to charge piezoelectric load 3, such that the power supply voltage signal corresponds to the reference voltage in the first interval. During the second operation interval, power stage circuit 2 can be controlled to operate in a reverse direction to discharge piezoelectric load 3, such that the power supply voltage signal corresponds to the reference voltage in the second interval. In addition, piezoelectric load 3 can charge rechargeable power supply 1 when discharging, so the excess energy stored in the piezoelectric load can be returned to the rechargeable power supply, which may reduce energy loss and system power consumption.

For example, the reference voltage in the first interval can be a rising part of the reference voltage within a period, and the reference voltage in the second interval may be a falling part of the reference voltage within the period. In one embodiment, the waveform of the reference voltage can be a sine wave with a trough value not less than zero, and in other embodiments, the waveform of the reference voltage can be another suitable type. Further, when the reference voltage increases, power stage circuit 2 may operate in the forward direction, and when the reference voltage decreases, power stage circuit 2 may operate in the reverse direction. For example, the power supply voltage signal can be equal to the voltage on the piezoelectric load when the piezoelectric load is driven, and when the reference voltage increases, the power supply voltage signal may be increased. That is, the voltage on the piezoelectric load may need to be increased, so the piezoelectric load can be charged, and power stage circuit 2 may operate in the forward direction. When the reference voltage decreases, the power supply voltage signal may need to be decreased. That is, the voltage on the piezoelectric load may need to be decreased, so the piezoelectric load can be discharged, and power stage circuit 2 may operate in the reverse direction.

The driving circuit can also include N voltage output circuits to drive N piezoelectric loads, respectively, where N is a positive integer. The N voltage output circuits can be connected in parallel with each other, and each of the voltage output circuits can include a selection switch. The selection switch can connect in series with the corresponding piezoelectric load driven by the corresponding voltage output circuit. The corresponding voltage output circuit can be switched on or off by controlling the switching states of the selection switch, and the piezoelectric load is driven or not driven accordingly.

In this example driving circuit, the power stage circuit can be controlled to operate in the forward direction or in the reverse direction to charge or discharge the piezoelectric load, in order to adjust the power supply voltage signal provided to the piezoelectric load to change with the reference voltage. The operation states of the power stage circuit can be controlled according to the reference voltage, such that the power supply voltage signal follows the reference voltage. The operation states of the power stage circuit include the operation directions and the switching states. For example, during the first operation interval, the power stage circuit can be controlled to operate in the forward direction to charge the piezoelectric load, such that the power supply voltage signal corresponds to the reference voltage in the first interval. During the second operation interval, the power stage circuit can be controlled to operate in the reverse direction to discharge the piezoelectric load, such that the power supply voltage signal corresponds to the reference voltage in the second interval.

For example, the reference voltage in the first interval is the rising part of the reference voltage within a period, and the reference voltage in the second interval is a falling part of the reference voltage within the period. In one embodiment, the waveform of the reference voltage can be a sine wave with a trough value not less than zero. The following examples are described whereby the waveform of the reference voltage is a sine wave with a trough value not less than zero as an example. However, the reference voltage may be in other forms, such as a rectified sine wave. Also, the piezoelectric load can include a piezoelectric device, such as a piezoelectric ceramic or a piezoelectric actuator.

Switches in the present invention can be implemented by any switching device or transistor (e.g., MOS transistors, BJTs, IGBTs, etc.). Power stage circuit 2 can be configured as a bidirectional converter (e.g., a bidirectional boost-buck converter, a bidirectional buck-boost converter, a bidirectional Cuk converter, a bidirectional Zeta-Sepic converter, a bidirectional flyback converter, a bidirectional forward converter, a bidirectional push-pull converter, a bidirectional half-bridge converter, a bidirectional full-bridge converter, etc.). The following description of particular embodiments is mainly based on the bidirectional flyback converter example.

In addition, controlling of the bidirectional flyback converter and the bidirectional boost-buck converter is facilitated due to only having two switches in the converter, so the bidirectional flyback converter and the bidirectional boost-buck converter are advantageous in many applications. Further, power stage circuit 2 in particular embodiments can be used in multiple operation modes (e.g., DCM, CCM, CRM, etc.). The following examples are described whereby power stage circuit 2 is used in DCM. Further, the second end of the power stage circuit can be coupled to an output capacitor in some cases, and not coupled to an output capacitor in other cases. When the second end of the power stage circuit is not coupled to an output capacitor, the power stage circuit may directly and only discharge the piezoelectric load, thereby reducing the energy loss.

The driving circuit according of particular embodiments can drive a piezoelectric load or multiple piezoelectric loads and may include a few switches and a relatively simple structure, thereby facilitating circuit integration. In addition, voltage output circuits can be added for driving piezoelectric loads, and voltage output circuits may not interfere with each other. The driving circuit of particular embodiments can output varying direct current voltage or alternating current voltage, and the output waveform of the driving circuit can be programmable. In some embodiments, all switches in the driving circuit are common ground switches, which may require simpler detection and control technologies than floating ground switches, thereby facilitating circuit integration. As compared to other approaches, the driving circuit of particular embodiments may have a relatively simple structure and including fewer devices, such that the volume of the driving circuit is reduced, the cost of the driving circuit is reduced, and power density of the driving circuit is improved. In addition, the piezoelectric load can charge the rechargeable power supply when discharging, so the excess energy stored in the piezoelectric load may be returned to the rechargeable power supply, which can save the energy of the drive system, facilitate the recycling of the energy, and reduce energy loss and system power consumption.

Figure 3:
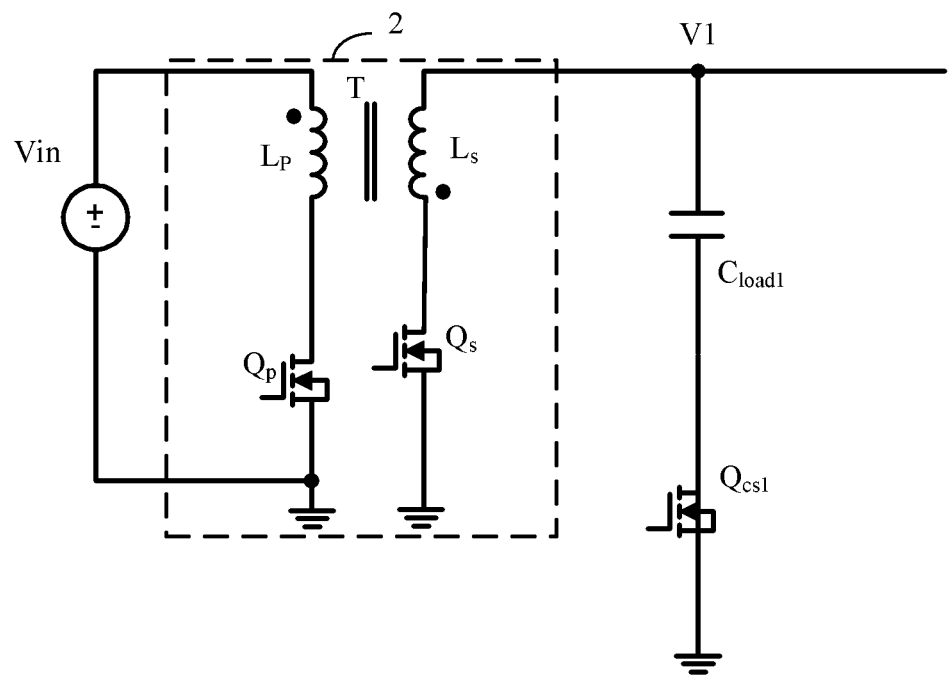
FIG. 3 is a schematic diagram of a first example driving circuit, in accordance with embodiments of the present invention.

Referring now to FIG. 3 is a schematic diagram of a first example driving circuit, in accordance with embodiments of the present invention. In this particular example, the driving circuit can include rechargeable power supply Vin and power stage circuit 2. The driving circuit can provide power supply voltage signal V1 to piezoelectric load $C_{load1}$, in order to drive piezoelectric load $C_{load1}$. Power stage circuit 2 can be coupled between rechargeable power supply Vin and piezoelectric load $C_{load1}$. During the first operation interval of the operation period, rechargeable power supply Vin can charge piezoelectric load $C_{load1}$ through power stage circuit 2, such that power supply voltage signal V1 provided to piezoelectric load $C_{load1}$ in the first operation interval corresponds to the reference voltage in the first interval. During the second operation interval of the operation period, piezoelectric load $C_{load1}$ can charge rechargeable power supply Vin through power stage circuit 2, such that power supply voltage signal V1 in the second operation interval corresponds to the reference voltage in the second interval. In particular embodiments, the waveform of the reference voltage can be a sine wave with a trough value not less than zero. In addition, the reference voltage in the first interval can be the rising part of the reference voltage within the period, and the reference voltage in the second interval can be the falling part of the reference voltage within the period.

In particular embodiments, the first end of power stage circuit 2 can connect to rechargeable power supply Vin, and the second end of power stage circuit 2 can connect to piezoelectric load $C_{load1}$. The driving circuit can also include a control circuit (not shown in FIG. 3). The control circuit can control the operation states of power stage circuit 2, such that power supply voltage signal V1 in the first operation interval corresponds to the reference voltage in the first interval, and power supply voltage signal V1 in the second operation interval corresponds to the reference voltage in the second interval. For example, during the first operation interval, power stage circuit 2 can be controlled to operate in the forward direction to charge piezoelectric load $C_{load1}$. During the second operation interval, power stage circuit 2 can be controlled to operate in the reverse direction to discharge piezoelectric load $C_{load1}$.

In particular embodiments, power stage circuit 2 is a bidirectional flyback converter, and can include primary switch $Q_p$, secondary switch $Q_s$, and transformer T. transformer T can include primary winding $L_p$ and secondary winding $L_s$. Primary winding $L_p$ and primary switch $Q_p$ can connect in series at the first end of power stage circuit 2. Secondary winding $L_s$ and secondary switch $Q_s$ can connect in series at the second end of power stage circuit 2. When piezoelectric load $C_{load1}$ is required to be driven, power supply voltage signal V1 may be generated at the second end of power stage circuit 2 to drive piezoelectric load $C_{load1}$. In particular embodiments, the second end of power stage circuit 2 may not be coupled with an output capacitor, and in this case, power stage circuit 2 may directly and only discharge the piezoelectric load, thereby reducing the energy loss. In other embodiments, the second end of power stage circuit 2 can be coupled to an output capacitor. In other examples, power stage circuit 2 can be any suitable converter (e.g., a bidirectional boost-buck converter, a bidirectional buck-boost converter, a bidirectional Cuk converter, a bidirectional Zeta-Sepic converter, a bidirectional forward converter, a bidirectional push-pull converter, a bidirectional half-bridge converter, a bidirectional full-bridge converter, a bidirectional converter of other topology type, etc.).

In particular embodiments, the control circuit can control the switching states of primary switch $Q_p$ and secondary switch $Q_s$ in power stage circuit 2, in order to adjust power supply voltage signal V1 to change with the reference voltage. For example, power supply voltage signal V1 in the first operation interval may correspond to the reference voltage in the first interval, and power supply voltage signal V1 in the second operation interval may correspond to the reference voltage in the second interval.

The driving circuit can also include a voltage output circuit that can include selection switch $Q_{cs1}$. Piezoelectric load $C_{load1}$ can connect in series with the selection switch $Q_{cs1}$ to form a branch, and the branch can connect at the second end of power stage circuit 2. The voltage output circuit may be switched on or off by controlling selection switch $Q_{cs1}$ to be switched on or off, to drive or not drive piezoelectric load $C_{load1}$. For example, in a case that piezoelectric load $C_{load1}$ is required to be driven, selection switch $Q_{cs1}$ can be controlled to be switched on and the driving circuit starts to operate. In other examples, the driving circuit may include no voltage output circuit, and power stage circuit 2 can connect in parallel with piezoelectric load $C_{load1}$. In particular embodiments, a terminal of selection switch $Q_{cs1}$ in the branch can be grounded, and the selection switch can be a common ground switch. In other examples, an end of piezoelectric load $C_{load1}$ in the branch can be grounded, and selection switch $Q_{cs1}$ may be a floating ground switch. In one example, selection switch $Q_{cs1}$ is a switching transistor. In particular embodiments, primary switch $Q_p$ and secondary switch $Q_s$ in power stage circuit 2 and selection switch $Q_{cs1}$ are all common ground switches. That is, switches in the driving circuit are all common ground switches, which may involve simpler detection and control technologies than floating ground switches, thereby facilitating circuit integration.

Figure 4:
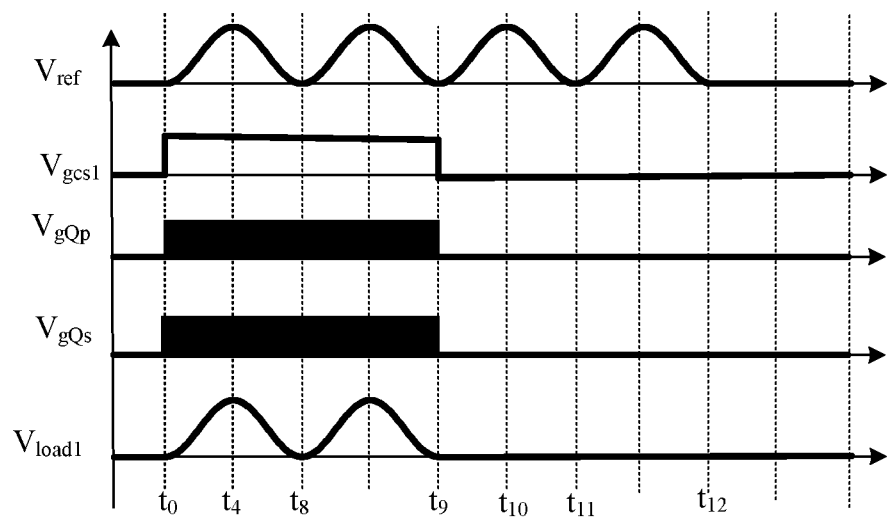
FIG. 4 is a waveform diagram of operation of the first example driving circuit, in accordance with embodiments of the present invention.
Figure 5:
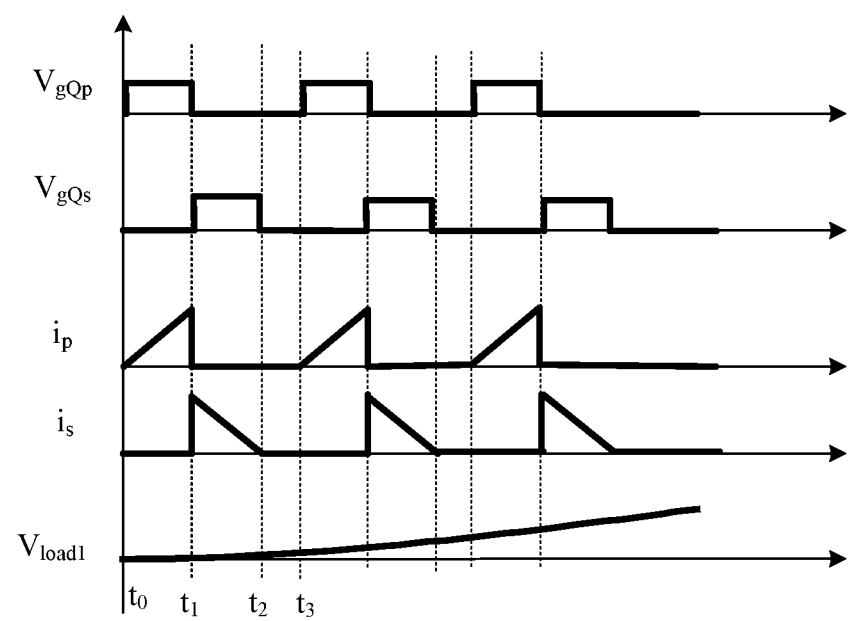
FIG. 5 is a waveform diagram of operation of the first example driving circuit in a charging phase, in accordance with embodiments of the present invention.
Figure 6:
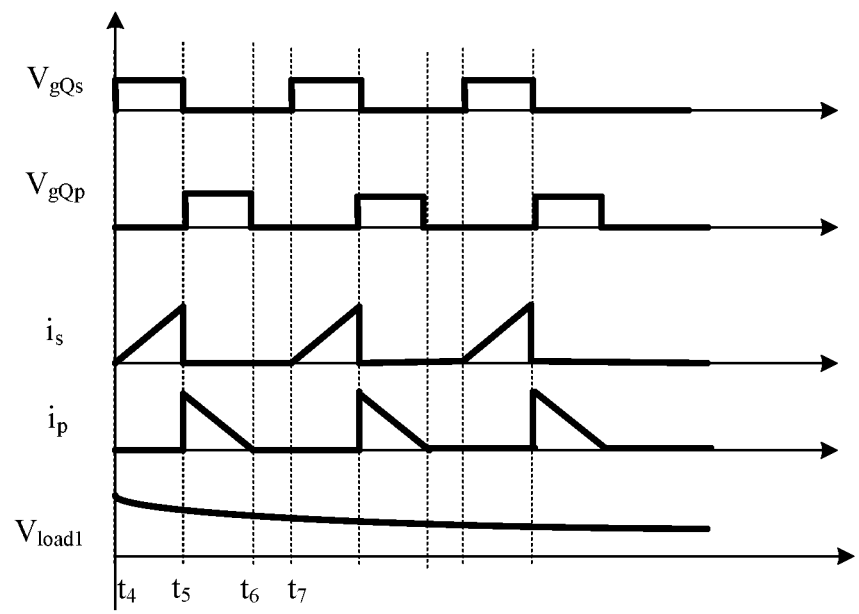
FIG. 6 is a waveform diagram of operation of the first example driving circuit in a discharging phase, in accordance with embodiments of the present invention.
Figure 7:
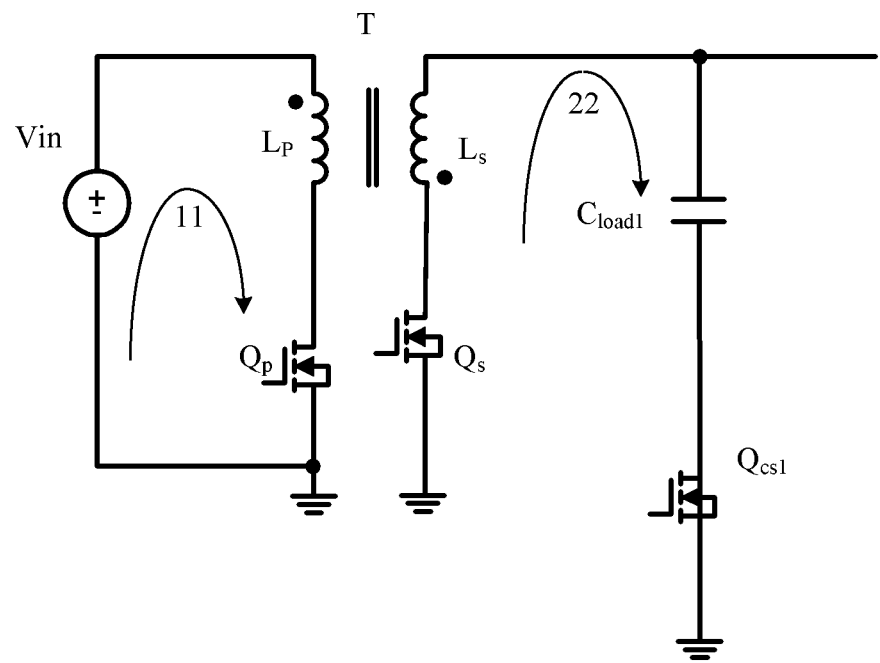
FIG. 7 is a schematic diagram showing operation states of the first example driving circuit in the charging phase, in accordance with embodiments of the present invention.
Figure 8:
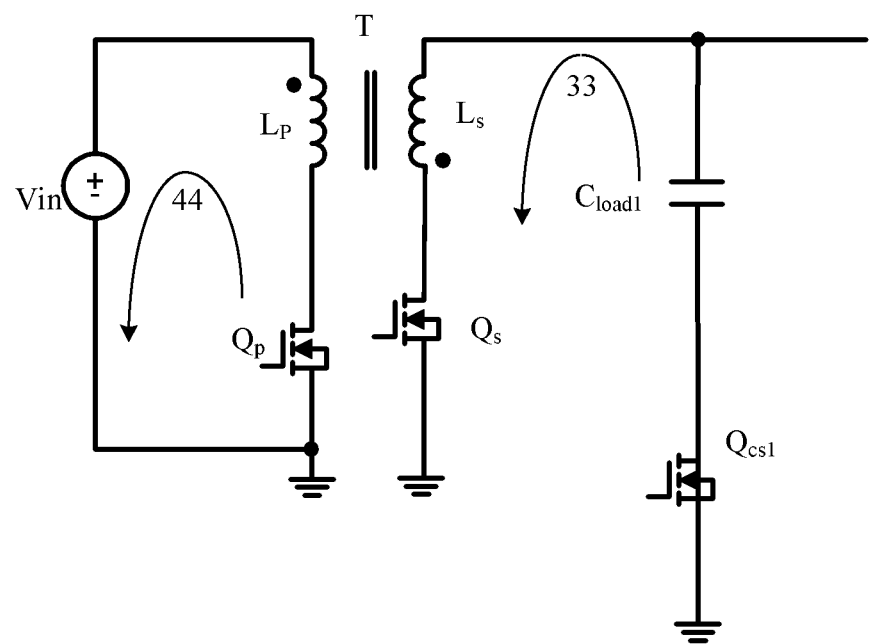
FIG. 8 is a schematic diagram showing operation states of the first example driving circuit in the discharging phase, in accordance with embodiments of the present invention.

Referring now to FIGS. 4, 5, 6, 7 and 8, an operation process of the first example driving circuit will be described below. In these diagrams, $V_{ref}$ may represent the reference voltage, and a waveform of the reference voltage is a sine wave with a trough value not less than zero. $V_{gQp}$ may represent a driving signal for primary switch $Q_p$, $V_{gQs}$ may represent a driving signal for the secondary switch $Q_s$, $V_{gcs1}$ may represent a driving signal for selection switch $Q_{cs1}$, $V_{load1}$ may represent a voltage difference between two ends of piezoelectric load $C_{load1}$, $i_p$ may represent a current passing through primary winding $L_p$, and $i_s$ may represent a current passing through secondary winding $L_s$. FIG. 4 is a waveform diagram of operation of the first example driving circuit, in accordance with embodiments of the present invention. FIG. 5 is a waveform diagram of operation of the first example driving circuit in a charging phase, in accordance with embodiments of the present invention. FIG. 6 is a waveform diagram of operation of the first example driving circuit in a discharging phase, in accordance with embodiments of the present invention. FIG. 5 shows operation waveforms in time interval $t_0$-$t_4$ in FIG. 4. FIG. 6 shows operation waveforms in time interval $t_4$-$t_8$ in FIG. 4. Time $t_0$ in FIGS. 4 and 5 may refer to the same time. Time $t_4$ is later than time $t_3$. Time $t_4$ in FIGS. 4 and 6 may refer to the same time. Also, $t_8$ is later than time $t_7$. For example, power supply voltage signal V1 can be set as voltage difference $V_{load1}$ between two ends of piezoelectric load $C_{load1}$.

At time $t_0$, $V_{gcs1}$ can be at a high level and selection switch $Q_{cs1}$ may be switched on. During time interval $t_0$-$t_4$, reference voltage $V_{ref}$ can increase, and power stage circuit 2 may operate in the forward direction. During time interval $t_0$-$t_1$, $V_{gQp}$ can be at a high level and $V_{gQs}$ may be at a low level, primary switch $Q_p$ can be turned on, and secondary switch $Q_s$ can be turned off, so current $i_p$ passing through primary winding $L_p$ may increase. Also, rechargeable power supply Vin can charge transformer T, and transformer T may store energy. The driving circuit can operate as shown by arrow 11 in FIG. 7. During time interval $t_1$-$t_2$, $V_{gQp}$ can be at a low level and $V_{gQs}$ may be at a high level, primary switch $Q_p$ can be turned off, and secondary switch $Q_s$ may be turned on, so current $i_s$ passing through secondary winding $L_s$ can decrease. Also, transformer T can charge piezoelectric load $C_{load1}$, and voltage difference $V_{load1}$ between two ends of piezoelectric load $C_{load1}$ may increase. The driving circuit may operate as shown by arrow 22 in FIG. 7. During time interval $t_2$-$t_3$, $V_{gQp}$ can be at a low level and $V_{gQs}$ may be at a low level, primary switch $Q_p$ can be turned off, and secondary switch $Q_s$ may be turned off. The operation process during time interval $t_0$-$t_3$ can be repeated, such that power supply voltage signal V1 increases with reference voltage $V_{ref}$, until time $t_4$. Power supply voltage signal $V_1$ may reach a maximum value of reference voltage $V_{ref}$ at time $t_4$.

As shown in FIG. 4, during time interval $t_0$-$t_4$, primary switch $Q_p$ and secondary switch $Q_s$ may operate in a PWM mode. During this time interval, rechargeable power supply Vin can charge piezoelectric load $C_{load1}$ through power stage circuit 2, such that power supply voltage signal V1 increases with reference voltage $V_{ref}$ in this time interval. Voltage difference $V_{load1}$ between two ends of piezoelectric load $C_{load1}$ during this time interval can be as shown in FIG. 4. During time interval $t_4$-$t_8$, reference voltage $V_{ref}$ may decrease, and power stage circuit 2 can operate in the reverse direction. During time interval $t_4$-$t_5$, $V_{gQp}$ may be at a low level and $V_{gQs}$ can be at a high level, primary switch $Q_p$ may be turned off, and secondary switch $Q_s$ can be turned on, so current $i_s$ passing through secondary winding $L_s$ can increase. Also, piezoelectric load $C_{load1}$ can charge transformer T, and transformer T may store energy, and voltage difference $V_{load1}$ between two ends of piezoelectric load $C_{load1}$ can decrease. The driving circuit operates as shown by arrow 33 in FIG. 8.

During time interval $t_5$-$t_6$, $V_{gQp}$ can be at a high level and $V_{gQs}$ may be at a low level, primary switch $Q_p$ can be turned on, and secondary switch $Q_s$ may be turned off, so current $i_p$ passing through primary winding $L_p$ can decrease. Also, transformer T can charge rechargeable power supply Vin, such that the excess energy on piezoelectric load $C_{load1}$ is fed back to rechargeable power supply Vin. The driving circuit may operate as shown by arrow 44 in FIG. 8. During time interval $t_6$-$t_7$, $V_{gQp}$ can be at a low level and $V_{gQs}$ may be at a low level, primary switch $Q_p$ is turned off, and secondary switch $Q_s$ is turned off. The operation process during time interval $t_4$-$t_7$ may be repeated, such that power supply voltage signal V1 decreases with reference voltage $V_{ref}$, until time $t_8$. Power supply voltage signal $V_1$ may reach a minimum value of reference voltage $V_{ref}$ at time $t_8$.

As shown in FIG. 4, during time interval $t_4$-$t_8$, primary switch $Q_p$ and secondary switch $Q_s$ operate in a PWM mode. During this time interval, piezoelectric load $C_{load1}$ can charge rechargeable power supply Vin through power stage circuit 2, such that power supply voltage signal V1 decreases with reference voltage $V_{ref}$ in this time interval. Voltage difference $V_{load1}$ between two ends of piezoelectric load $C_{load1}$ during this time interval is as shown in FIG. 4. Time interval $t_0$-$t_8$ is one operation period, and the operation process during time interval $t_0$-$t_8$ is repeated, such that power supply voltage signal V1 changes with reference voltage $V_{ref}$, until time $t_9$. At time $t_9$, selection switch $Q_{cs1}$ may be turned off, such that piezoelectric load $C_{load1}$ is disconnected from the driving circuit, and voltage difference $V_{load1}$ between two ends of piezoelectric load $C_{load1}$ can be equal to 0.

Figure 9:
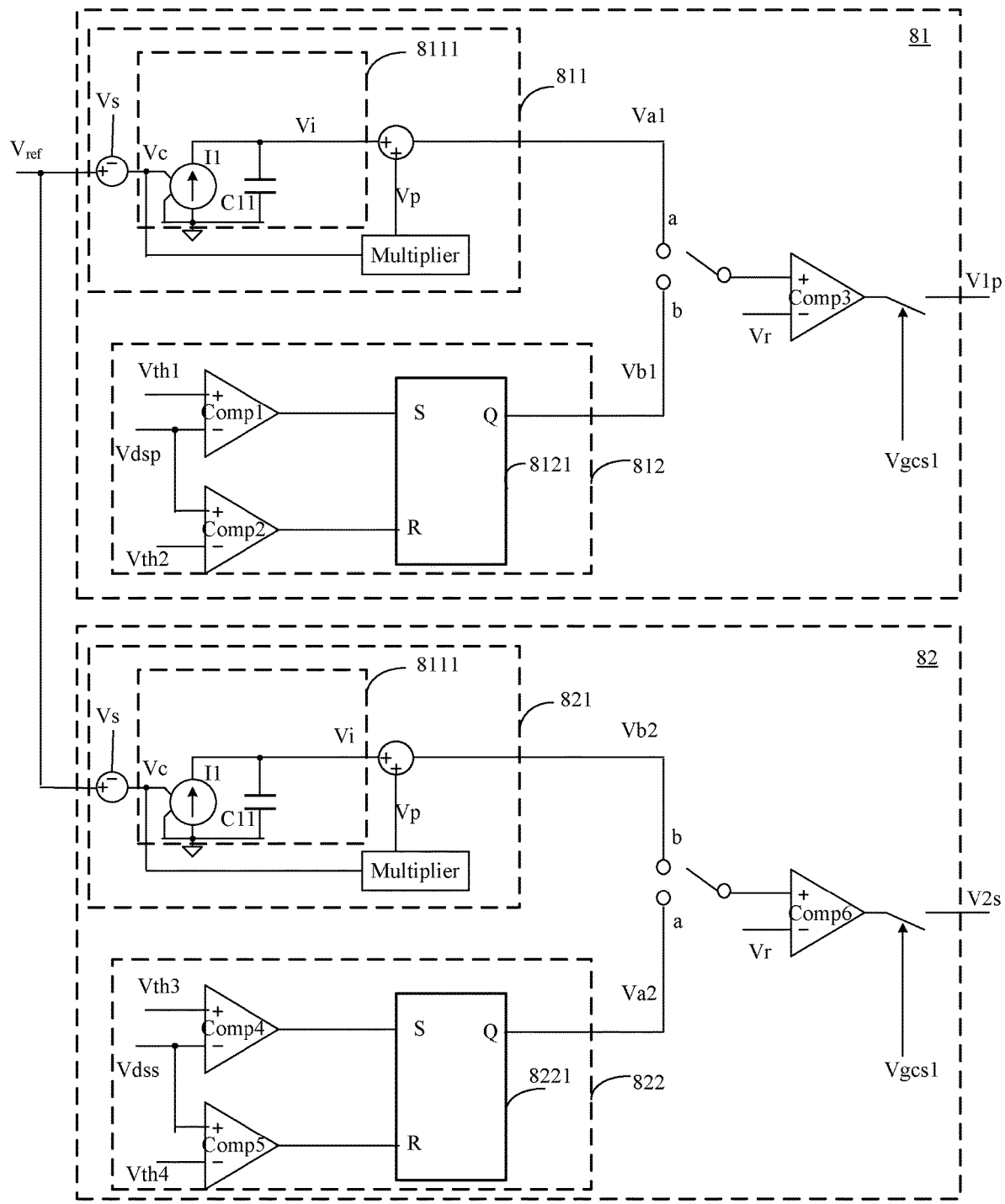
FIG. 9 is a schematic diagram of an example control circuit of the first example driving circuit, in accordance with embodiments of the present invention.

Referring now to FIG. 9, shown is a schematic diagram of an example control circuit of the first example driving circuit, in accordance with embodiments of the present invention. The control circuit can include control circuits 81 and 82. Control circuit 81 can generate control signal V1p to control primary switch $Q_p$ to be switch on or switched off. Control circuit 82 can generate control signal V2s to control secondary switch $Q_s$ to be switch on or switched off. During the first operation interval, control circuit 81 may generate control signal V1p according to compensation signal Vc, and compensation signal Vc may indicate a difference between reference voltage $V_{ref}$ and sampling signal Vs characterizing the power supply voltage signal. In addition, control circuit 82 may generate control signal V2s according to drain-source voltage Vdss of secondary switch $Q_s$. In the first operation interval, reference voltage $V_{ref}$ can increase, and piezoelectric load $C_{load1}$ may be charged.

During the second operation interval, control circuit 81 may generate control signal V1p according to drain-source voltage Vdsp of primary switch $Q_p$. In addition, control circuit 82 may generate control signal V2s according to compensation signal Vc, and compensation signal Vc may indicate a difference between reference voltage $V_{ref}$ and sampling signal Vs characterizing the power supply voltage signal. In the second operation interval, reference voltage $V_{ref}$ can decrease, and piezoelectric load $C_{load1}$ may discharge electricity.

Control circuit 81 can include signal generation circuit 811, signal generation circuit 812, and comparator Comp3. Signal generation circuit 811 may generate signal Va1 according to compensation signal Vc, and signal generation circuit 812 may generate signal Vb1 according to drain-source voltage Vdsp of primary switch $Q_p$. The first input terminal of comparator Comp3 may receive ramp signal Vr, and the second input terminal of comparator Comp3 may receive signal Va1 in the first operation interval, and signal Vb1 in the second operation interval. The output signal of comparator Comp3 can be control signal V1p when selection switch $Q_{cs1}$ is turned on.

Control circuit 82 can include signal generation circuit 821, signal generation circuit 822, and comparator Comp6. Signal generation circuit 821 may generate signal Vb2 according to compensation signal Vc, and signal generation circuit 822 may generate signal Va2 according to drain-source voltage Vdss of secondary switch $Q_s$. The first terminal of comparator Comp6 may receive ramp signal Vr, and the second terminal of comparator Comp6 may receive signal Va2 in the first operation interval, and signal Vb2 in the second operation interval. The output signal of comparator Comp6 can be control signal V2s when selection switch $Q_{cs1}$ is turned on.

Compensation signal Vc can be controlled by PI to obtain signal Va1 or signal Vb2. For example, both signal generation circuits 811 and 821 can include integration circuit 8111 and a multiplier. Integration circuit 8111 and the multiplier may both receive compensation signal Vc. Output signal Vi of integration circuit 8111 and output signal Vp of the multiplier can be superimposed to obtain signal Va1 or signal Vb2. In addition, compensation signal Vc may indicate a difference between reference voltage $V_{ref}$ and sampling signal Vs characterizing the power supply voltage signal. Integration circuit 8111 can include voltage-controlled current source I1 and capacitor C11. Voltage-controlled current source I1 may receive compensation signal Vc, and can output a current to charge capacitor C11. A voltage across capacitor C11 may serve as output signal Vi of integration circuit 8111.

Signal generation circuit 812 can include comparator Comp1, comparator Comp2, and SR flip-flop 8121. The first input terminal of comparator Comp1 may receive threshold Vth1, and the second input terminal of comparator Comp1 may receive drain-source voltage Vdsp of primary switch $Q_p$. The output terminal of comparator Comp1 can connect to the S terminal of SR flip-flop 8121. The first input terminal of comparator Comp2 may receive drain-source voltage Vdsp of primary switch $Q_p$, the second input terminal of comparator Comp2 may receive threshold Vth2. The output terminal of comparator Comp2 can connect to the R terminal of SR flip-flop 8121. Output terminal Q of SR flip-flop 8121 may output signal Vb1.

Signal generation circuit 822 can include comparator Comp4, comparator Comp5, and SR flip-flop 8221. The first input terminal of comparator Comp4 may receive threshold Vth3, and the second input terminal of comparator Comp4 may receive drain-source voltage Vdss of secondary switch $Q_s$. The output terminal of comparator Comp4 can connect to the S terminal of SR flip-flop 8221. The first input terminal of comparator Comp5 may receive drain-source voltage Vdss of secondary switch $Q_s$, the second input terminal of comparator Comp5 may receive threshold Vth4. The output terminal of comparator Comp5 can connect to the R terminal of SR flip-flop 8221. Output terminal Q of SR flip-flop 8221 can output signal Va2.

The first example driving circuit can drive one piezoelectric load. Therefore, this example driving circuit can include only one voltage output circuit; that is, the driving circuit may have a single output. In particular embodiments, the driving circuit can further be configured to drive multiple piezoelectric loads; that is, the driving circuit may have multiple outputs. For example, the driving circuit can include at least two voltage output circuits that are connected in parallel with each other. Each of the voltage output circuits can include a selection switch, and the selection switch can connect in series with a piezoelectric load driven by the voltage output circuit, and may be switched on or off to control the voltage output circuit to be on or off. For convenience of describing the following examples, the driving circuit can include two outputs to drive two piezoelectric loads. However, the particular number of the output of the driving circuit and the number of piezoelectric loads driven by the driving circuit can be any positive integer.

Figure 10:
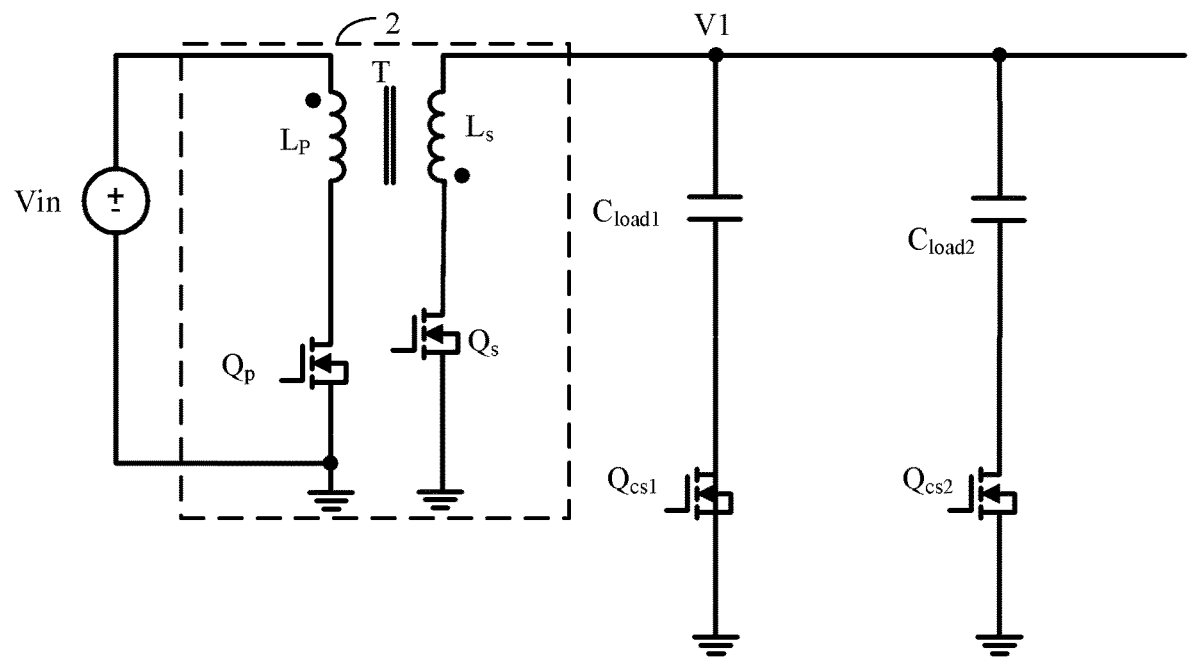
FIG. 10 is a schematic diagram of a second example driving circuit, in accordance with embodiments of the present invention.

Referring now to FIG. 10, shown is a schematic diagram of a second example driving circuit, in accordance with embodiments of the present invention. In this particular example, the driving circuit can include two voltage output circuits, and the two voltage output circuits can connect in parallel at the second end of power stage circuit 2. The driving circuit can include a first voltage output circuit and a second voltage output circuit. The first voltage output circuit and the second voltage output circuit can include selection switch $Q_{cs1}$ and selection switch $Q_{cs2}$, respectively. Selection switch $Q_{cs1}$ can connect in series with piezoelectric load $C_{load1}$, and may be controlled to be switched on or off to control the first voltage output circuit to be on or off, in order to drive or not drive piezoelectric load $C_{load1}$. Selection switch $Q_{cs2}$ can connect in series with piezoelectric load $C_{load2}$, and may be controlled to be switched on or off to control the second voltage output circuit to be on or off, in order to drive or not drive piezoelectric load $C_{load2}$.

Figure 11:
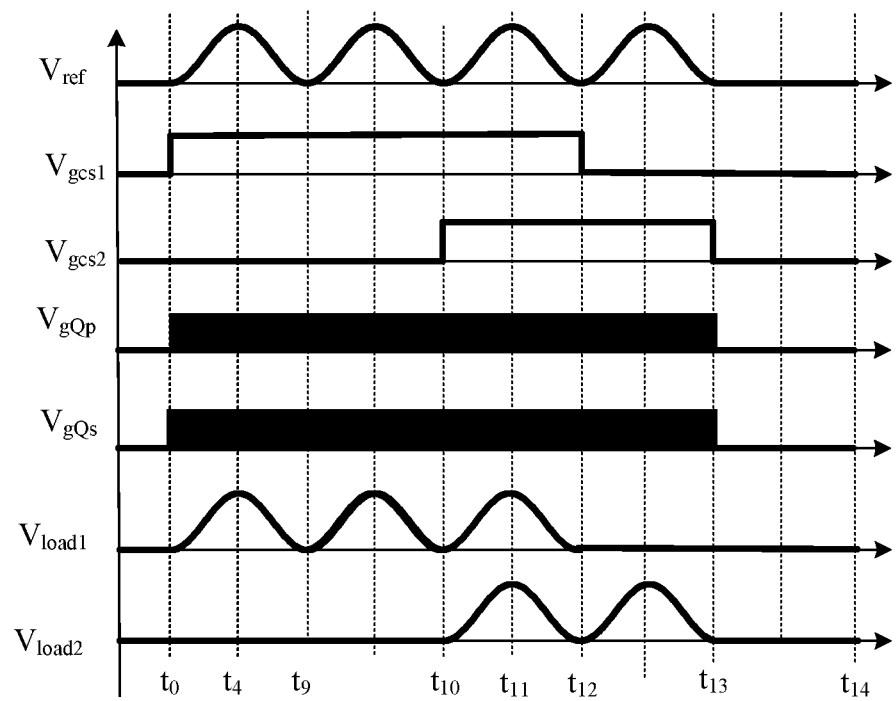
FIG. 11 is a waveform diagram of operation of the second example driving circuit, in accordance with embodiments of the present invention.

An operation process of the driving circuit according to this example is described below in conjunction with FIGS. 10 and 11. $V_{ref}$ may represent the reference voltage, and a waveform of the reference voltage is a sine wave with a trough value not less than zero. $V_{gQp}$ may represent a driving signal for primary switch $Q_p$, $V_{gQs}$ may represent a driving signal for secondary switch $Q_s$, $V_{gcs1}$ may represent a driving signal for selection switch $Q_{cs1}$, $V_{gcs2}$ may represent a driving signal for selection switch $Q_{cs2}$, $V_{load1}$ may represent a voltage difference between two ends of piezoelectric load $C_{load1}$, and $V_{load2}$ may represent a voltage difference between two ends of piezoelectric load $C_{load2}$. During time interval $t_0$-$t_{12}$, $V_{gcs1}$ is at a high level, selection switch $Q_{cs1}$ is switched on, such that the first voltage output circuit is switched on. A waveform of voltage difference $V_{load1}$ between two ends of piezoelectric load $C_{load1}$ is the same as the waveform of voltage difference $V_{load1}$ in the first embodiment. In addition, the operation process of the driving circuit according to the second embodiment during this time interval is the same as that in the first embodiment, and is not described in detail here.

During time interval $t_0$-$t_{13}$, $V_{gcs2}$ can be at a high level, and selection switch $Q_{cs2}$ may be switched on, such that the second voltage output circuit is switched on. A waveform of voltage difference $V_{load2}$ between two ends of piezoelectric load $C_{load2}$ can be the same as the waveform of voltage difference $V_{load1}$ in the first example above. In addition, the operation process of the driving circuit in this example during this time interval may be the same as that in the first example above. During time interval $t_{10}$-$t_{12}$, $V_{gcs1}$ and $V_{gcs2}$ can both be at a high level, such that the two voltage output circuits are all switched on to drive piezoelectric load $C_{load1}$ and piezoelectric load $C_{load2}$, respectively. During time interval $t_{13}$-$t_{14}$, $V_{gcs}$i and $V_{gcs2}$ may both be at a low level, such that the two voltage output circuits are all switched off.

The following examples three to six of certain embodiments can also be used to drive one or multiple piezoelectric loads. For the convenience of description, only the case of driving multiple piezoelectric loads is given here. Further, the manner of driving one piezoelectric load in the following examples can be similar to that in the first example above.

Figure 12:
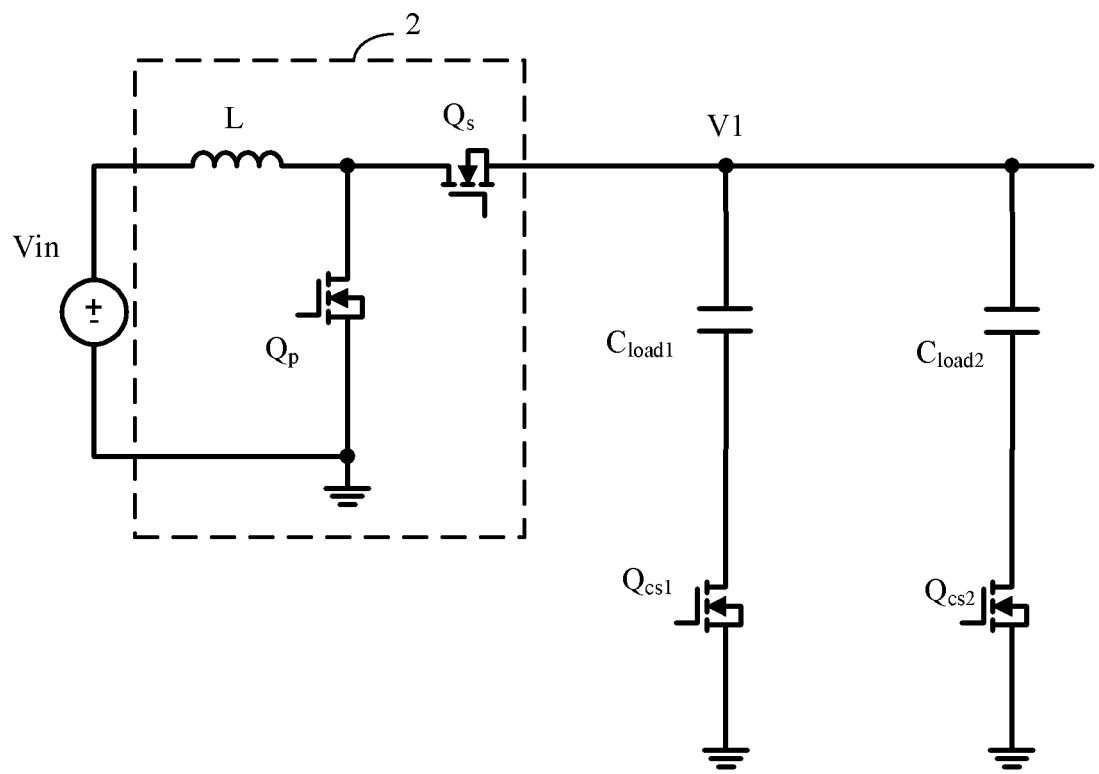
FIG. 12 is a schematic diagram of a third example driving circuit, in accordance with embodiments of the present invention.

Referring now to FIG. 12, shown is a schematic diagram of a third example driving circuit, in accordance with embodiments of the present invention. This particular example driving circuit can include power stage circuit 2 configured as a bidirectional boost-buck converter. The bidirectional boost-buck converter can include inductor L and switches $Q_p$ and $Q_s$. Inductor L and switch $Q_p$ can connect in series at output end of rechargeable power supply Vin. A common end of inductor L and switch $Q_p$ can connect to one terminal of switch $Q_s$, and the other terminal of switch $Q_s$ can be the high potential end of the second end of power stage circuit 2. The low potential end of the power stage circuit 2 can be grounded. When piezoelectric load $C_{load1}$ or $C_{load2}$ is required to be driven, power supply voltage signal V1 can be generated at the second end of power stage circuit 2, in order to drive piezoelectric load $C_{load1}$ or $C_{load2}$.

Figure 13:
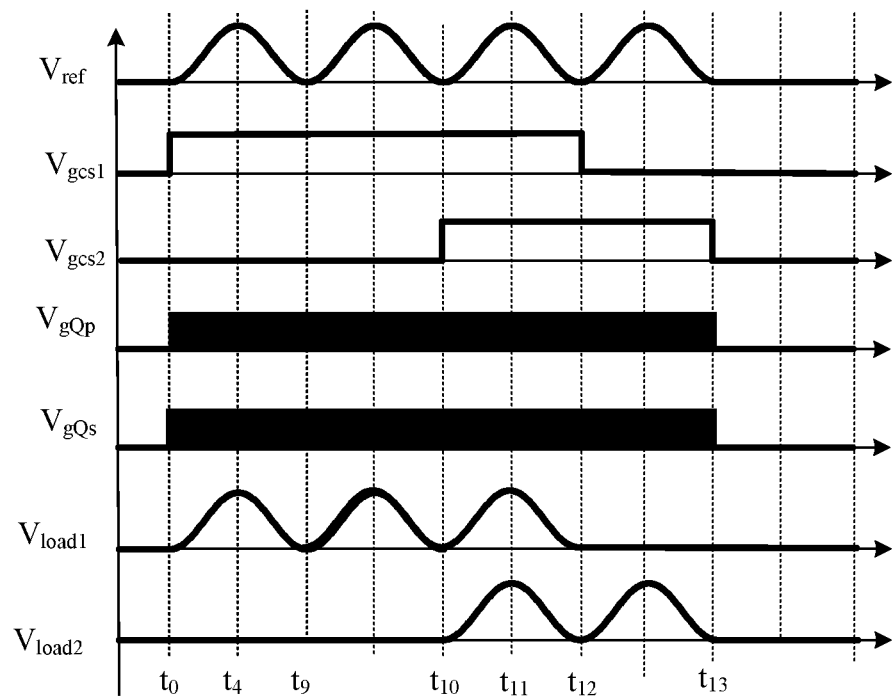
FIG. 13 is a waveform diagram of operation of the third example driving circuit, in accordance with embodiments of the present invention.

An operation process of the driving circuit according to this example is described below in conjunction with FIGS. 12 and 13. $V_{ref}$ may represent the reference voltage, and a waveform of the reference voltage can be a sine wave with a trough value not less than zero. $V_{gQp}$ may represent a driving signal for switch $Q_p$, $V_{gQs}$ may represent a driving signal for switch $Q_s$, $V_{gcs1}$ may represent a driving signal for selection switch $Q_{cs1}$, $V_{gcs2}$ may represent a driving signal for selection switch $Qc_{s2}$, $V_{load1}$ may represent a voltage difference between two ends of piezoelectric load $C_{load1}$, and $V_{load2}$ may represent a voltage difference between two ends of piezoelectric load $C_{load2}$.

For driving piezoelectric load $C_{load1}$, at time $t_0$, $V_{gcs1}$ can be at a high level and selection switch $Q_{cs1}$ may be switched on. During time interval $t_0$-$t_4$, reference voltage $V_{ref}$ can increase, and power stage circuit 2 may operate in the forward direction. During time interval $t_0$-$t_4$, switches $Q_p$ and $Q_s$ may operate in a PWM mode, and power stage circuit 2 can operate as a boost circuit. During this time interval, rechargeable power supply Vin can charge piezoelectric load $C_{load1}$ through power stage circuit 2, such that power supply voltage signal V1 increases with reference voltage $V_{ref}$ in this time interval. Voltage difference $V_{load1}$ between two ends of piezoelectric load $C_{load1}$ during this time interval can be as shown in FIG. 13. During time interval $t_4$-$t_9$, reference voltage $V_{ref}$ may decrease, and power stage circuit 2 can operate in the reverse direction.

During time interval $t_4$-$t_9$, switches $Q_p$ and $Q_s$ may operate in a PWM mode, and power stage circuit 2 can operate as a buck circuit. During this time interval, piezoelectric load $C_{load1}$ can charge rechargeable power supply Vin through power stage circuit 2. As such, piezoelectric load $C_{load1}$ can be discharged, such that power supply voltage signal V1 decreases with reference voltage $V_{ref}$ in this time interval. Voltage difference $V_{load1}$ between two ends of piezoelectric load $C_{load1}$ during this time interval can be as shown in FIG. 13. Time interval $t_0$-$t_9$ is one operation period, and the operation process during time interval $t_0$-$t_9$ may be repeated, such that power supply voltage signal V1 changes with reference voltage $V_{ref}$, until time $t_{12}$. At time $t_{12}$, selection switch $Q_{cs1}$ can be turned off, such that piezoelectric load $C_{load1}$ is essentially disconnected from the driving circuit, and voltage difference $V_{load1}$ between two ends of piezoelectric load $C_{load1}$ can be equal to 0.

For driving piezoelectric load $C_{load2}$, during time interval $t_{10}$-$t_{13}$, $V_{gcs2}$ can be at a high level and selection switch $Q_{cs2}$ may be switched on. A waveform of voltage difference $V_{load2}$ between two ends of piezoelectric load $C_{load2}$ can be the same as the waveform of voltage difference $V_{load1}$ when piezoelectric load $C_{load1}$ is driven. In addition, the operation process of driving circuit when selection switch $Q_{cs1}$ is turned on may be the same as the operation process of driving circuit when selection switch $Q_{cs2}$ is turned on. During time interval $t_{10}$-$t_{12}$, $V_{gcs1}$ and $V_{gcs2}$ may both be at a high level, such that the two voltage output circuits are all switched on to drive piezoelectric loads $C_{load1}$ and $C_{load2}$, respectively. At time $t_{13}$, $V_{gcs1}$ and $V_{gcs2}$ may both be at a low level, such that the two voltage output circuits are all switched off. Voltage difference $V_{load1}$ between two ends of piezoelectric load $C_{load1}$ can be equal to 0, and voltage difference $V_{load2}$ between two ends of piezoelectric load $C_{load2}$ may be equal to 0.

Figure 14:
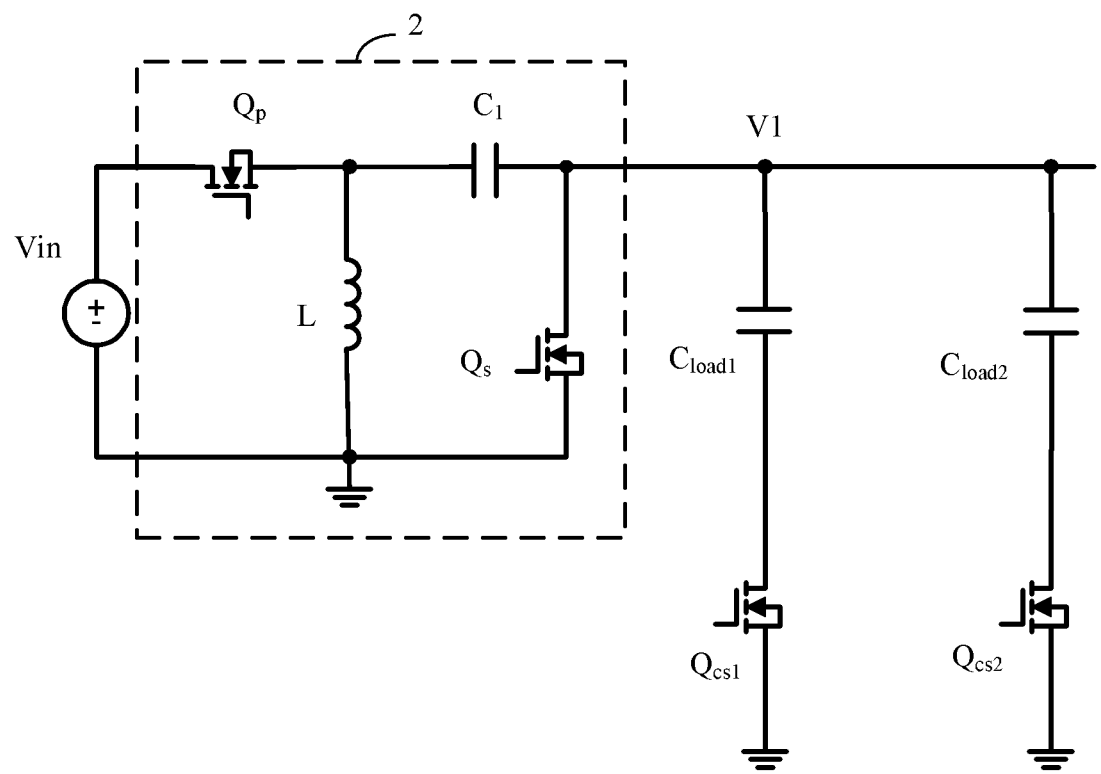
FIG. 14 is a schematic diagram of a fourth example driving circuit, in accordance with embodiments of the present invention.

Referring now to FIG. 14, shown is a schematic diagram of a fourth example driving circuit, in accordance with embodiments of the present invention. This particular example driving circuit can include power stage circuit 2 configured as a bidirectional Zeta-Sepic converter. The bidirectional Zeta-Sepic converter can include inductor L, switch $Q_p$, capacitor $C_1$, and switch $Q_s$. Inductor L and switch $Q_p$ can connect in series at output end of rechargeable power supply Vin, the common end of inductor L and switch $Q_p$ can connect to one terminal of capacitor $C_1$, and the other terminal of capacitor $C_1$ may be the high potential end of the second end of power stage circuit 2. The low potential end of the second end of power stage circuit 2 can be the ground potential. Switch $Q_s$ can connect at the second end of power stage circuit 2. When piezoelectric load $C_{load1}$ or $C_{load2}$ is required to be driven, power supply voltage signal V1 may be generated at the second end of power stage circuit 2, in order to drive piezoelectric load $C_{load1}$ or $C_{load2}$. In certain embodiments, the voltage of the first end of bidirectional Zeta-Sepic converter can be greater than or equal to or less than the voltage of the second end of bidirectional Zeta-Sepic converter.

Figure 15:
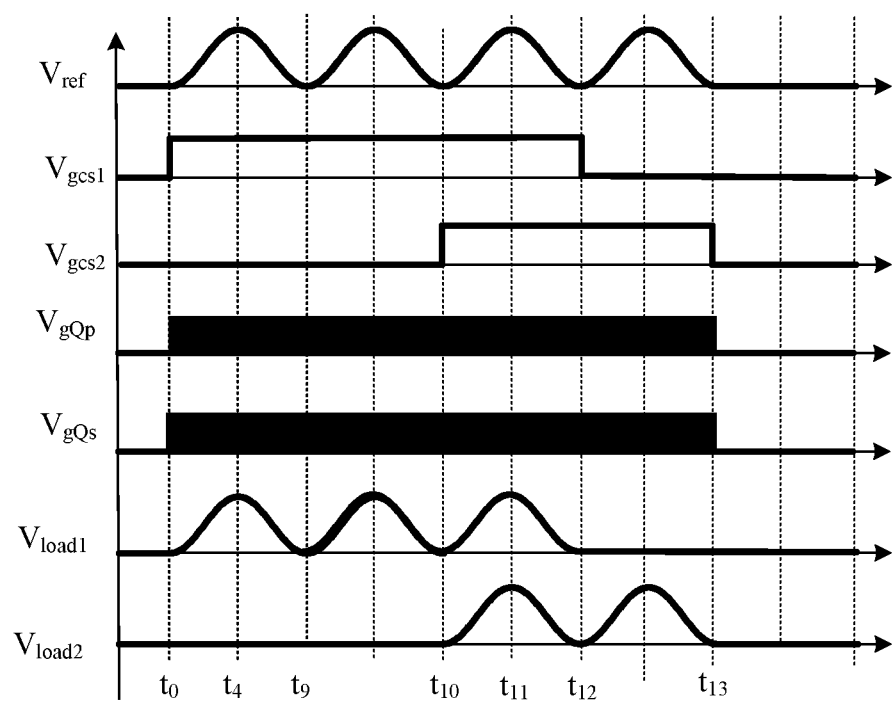
FIG. 15 is a waveform diagram of operation of the fourth example driving circuit, in accordance with embodiments of the present invention.

An operation process of the driving circuit according to this example described below in conjunction with FIGS. 14 and 15. $V_{ref}$ represents the reference voltage. A waveform of the reference voltage can be a sine wave with a trough value not less than zero. $V_{gQp}$ may represent a driving signal for switch $Q_p$, $V_{gQs}$ may represent a driving signal for switch $Q_s$, $V_{gcs1}$ may represent a driving signal for selection switch $Q_{cs1}$, $V_{gcs2}$ may represent a driving signal for selection switch $Q_{cs2}$, $V_{load1}$ may represent a voltage difference between two ends of piezoelectric load $C_{load1}$, and $V_{load2}$ may represent a voltage difference between two ends of piezoelectric load $C_{load2}$.

For driving piezoelectric load $C_{load1}$, at time to, $V_{gcs1}$ can be at a high level and selection switch $Q_{cs1}$ may be switched on. During time interval $t_0$-$t_4$, reference voltage $V_{ref}$ can increase, and power stage circuit 2 may operate in the forward direction. During time interval $t_0$-$t_4$, switches $Q_p$ and $Q_s$ may operate in a PWM mode. During this time interval, rechargeable power supply Vin can charge piezoelectric load $C_{load1}$ through power stage circuit 2, such that power supply voltage signal V1 increases with reference voltage $V_{ref}$ in this time interval. Voltage difference $V_{load1}$ between two ends of piezoelectric load $C_{load1}$ during this time interval can be as shown in FIG. 15. During time interval $t_4$-$t_9$, reference voltage $V_{ref}$ may decrease, and power stage circuit 2 can operate in the reverse direction.

During time interval $t_4$-$t_9$, switches $Q_p$ and $Q_s$ may operate in a PWM mode. During this time interval, piezoelectric load $C_{load1}$ can charge rechargeable power supply Vin through power stage circuit 2. As such, piezoelectric load $C_{load1}$ may be discharged, such that power supply voltage signal V1 decreases with reference voltage $V_{ref}$ in this time interval. Voltage difference $V_{load1}$ between two ends of piezoelectric load $C_{load1}$ during this time interval may be as shown in FIG. 15. Time interval $t_0$-$t_9$ is one operation period, and the operation process during time interval $t_0$-$t_9$ may be repeated, such that power supply voltage signal V1 changes with reference voltage $V_{ref}$, until time $t_{12}$. At time $t_{12}$, selection switch $Q_{cs1}$ can be turned off, such that piezoelectric load $C_{load1}$ is essentially disconnected from the driving circuit, and voltage difference $V_{load1}$ between two ends of piezoelectric load $C_{load1}$ may be equal to 0.

For driving piezoelectric load $C_{load2}$, during time interval $t_{10}$-$t_{13}$, $V_{gcs2}$ can be at a high level and selection switch $Q_{cs2}$ may be switched on. A waveform of voltage difference $V_{load2}$ between two ends of piezoelectric load $C_{load2}$ may be the same as the waveform of voltage difference $V_{load1}$ when piezoelectric load $C_{load1}$ is driven. In addition, the operation process of driving circuit when selection switch $Q_{cs2}$ is turned on may be the same as the operation process of driving circuit when selection switch $Q_{cs1}$ is turned on. During time interval $t_{10}$-$t_{12}$, $V_{gcs1}$ and $V_{gcs2}$ may both at a high level, such that the two voltage output circuits are all switched on to drive piezoelectric loads $C_{load1}$ and $C_{load2}$, respectively. At time $t_{13}$, $V_{gcs1}$ and $V_{gcs2}$ may both be at a low level, such that the two voltage output circuits are all switched off. Voltage difference $V_{load1}$ between two ends of piezoelectric load $C_{load1}$ may be equal to 0, and voltage difference $V_{load2}$ between two ends of piezoelectric load $C_{load2}$ may be equal to 0.

Figure 16:
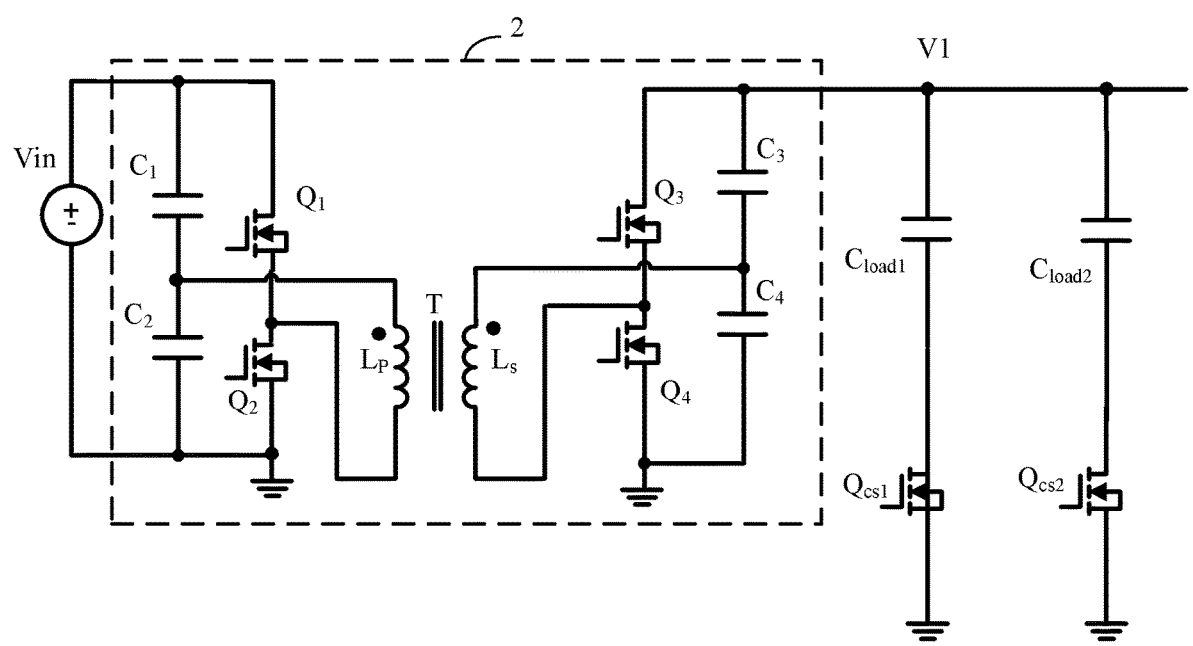
FIG. 16 is a schematic diagram of a fifth example driving circuit, in accordance with embodiments of the present invention.

Referring now to FIG. 16, shown is a schematic diagram of a fifth example driving circuit, in accordance with embodiments of the present invention. In this particular example driving circuit, power stage circuit 2 can be configured as a bidirectional half-bridge converter. The bidirectional half-bridge converter can include transformer T, switches $Q_1$, $Q_2$, $Q_3$, and $Q_4$, and capacitors $C_1$, $C_2$, $C_3$, and $C_4$. Transformer T can include primary winding $L_p$ and secondary winding $L_s$. Capacitors $C_1$ and $C_2$ can connect in series at output end of rechargeable power supply Vin, switches $Q_1$ and $Q_2$ can connect in series at output end of rechargeable power supply Vin, one terminal of primary winding $L_p$ can connect to the common end of capacitors $C_1$ and $C_2$, and the other terminal of primary winding $L_p$ can connect to the common end of switches $Q_1$ and $Q_2$. Capacitors $C_3$ and $C_4$ can connect in series at the second end of power stage circuit 2. Switches $Q_3$ and $Q_4$ can connect in series at the second end of power stage circuit 2. One terminal of secondary winding $L_s$ can connect to the common end of capacitors $C_3$ and $C_4$, and the other terminal of secondary winding $L_s$ can connect to the common end of switches $Q_3$ and $Q_4$. When piezoelectric load $C_{load1}$ or $C_{load2}$ is required to be driven, power supply voltage signal V1 may be generated at the second end of power stage circuit 2 to drive piezoelectric load $C_{load1}$ or $C_{load2}$.

Figure 17:
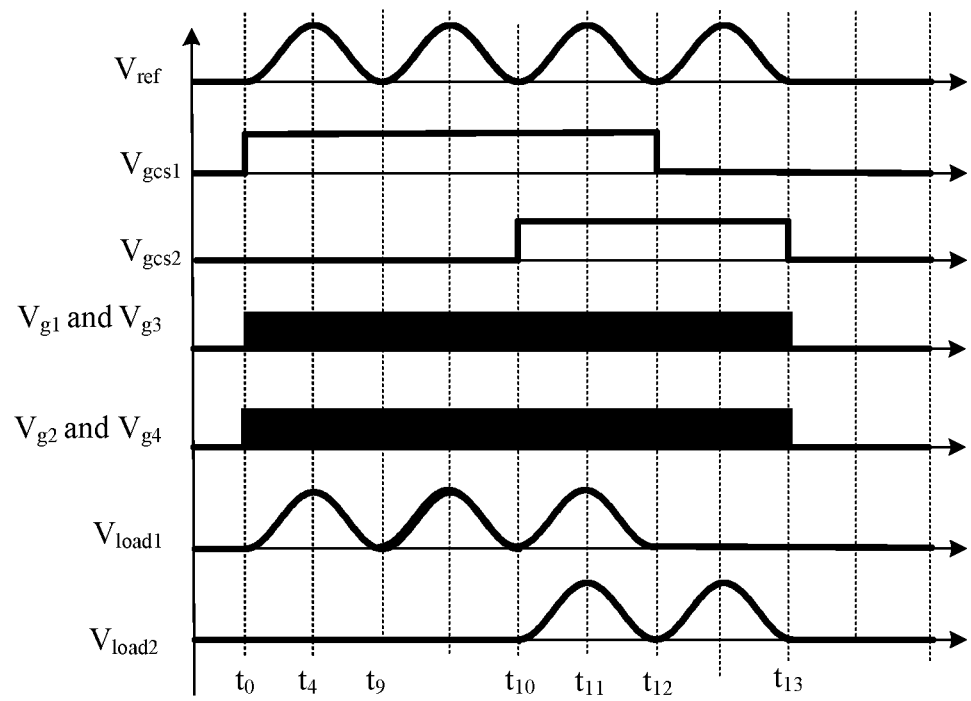
FIG. 17 is a waveform diagram of operation of the fifth example driving circuit, in accordance with embodiments of the present invention.

An operation process of the driving circuit according to this particular example is described below in conjunction with FIGS. 16 and 17. $V_{ref}$ may represent the reference voltage, and a waveform of the reference voltage may be a sine wave with a trough value not less than zero. $V_{g1}$ and $V_{g3}$ may represent a driving signal for switches $Q_1$ and $Q_3$, and $V_{g2}$ and $V_{g4}$ may represent a driving signal for switches $Q_2$ and $Q_4$, $V_{gcs1}$ may represent a driving signal for selection switch $Q_{cs1}$, $V_{gcs2}$ may represent a driving signal for selection switch $Q_{cs2}$, $V_{load1}$ may represent a voltage difference between two ends of piezoelectric load $C_{load1}$, and $V_{load2}$ may represent a voltage difference between two ends of piezoelectric load $C_{load2}$. For example, the switching states of switches $Q_1$ and $Q_3$ can be the same, and the switching states of switches $Q_2$ and $Q_4$ may be the same.

For driving piezoelectric load $C_{load1}$, at time $t_0$, $V_{gcs1}$ can be at a high level and selection switch $Q_{cs1}$ may be switched on. During time interval $t_0$-$t_4$, reference voltage $V_{ref}$ can increase, and power stage circuit 2 may operate in the forward direction. During time interval $t_0$-$t_4$, switches $Q_1$, $Q_2$, $Q_3$, and $Q_4$ may operate in a PWM mode. During this time interval, rechargeable power supply Vin can charge piezoelectric load $C_{load1}$ through power stage circuit 2, such that power supply voltage signal V1 increases with reference voltage $V_{ref}$ in this time interval. Voltage difference $V_{load1}$ between two ends of piezoelectric load $C_{load1}$ during this time interval can be as shown in FIG. 17.

During time interval $t_4$-$t_9$, reference voltage $V_{ref}$ may decrease, and power stage circuit 2 can operate in the reverse direction. During time interval $t_4$-$t_9$, switches $Q_1$, $Q_2$, $Q_3$, and $Q_4$ may operate in a PWM mode. During this time interval, piezoelectric load $C_{load1}$ can charge rechargeable power supply Vin through power stage circuit 2. As such, piezoelectric load $C_{load1}$ can be discharged, such that power supply voltage signal V1 may decrease with reference voltage $V_{ref}$ in this time interval. Voltage difference $V_{load1}$ between two ends of piezoelectric load $C_{load1}$ during this time interval may be as shown in FIG. 17.

Time interval $t_0$-$t_9$ is one operation period, and the operation process during time interval $t_0$-$t_9$ may be repeated, such that power supply voltage signal V1 changes with reference voltage $V_{ref}$, until time $t_{12}$. At time $t_{12}$, selection switch $Q_{cs1}$ can be turned off, such that piezoelectric load $C_{load1}$ is essentially disconnected from the driving circuit, and voltage difference $V_{load1}$ between two ends of piezoelectric load $C_{load1}$ can be equal to 0. For driving piezoelectric load $C_{load2}$, during time interval $t_{10}$-$t_{13}$, $V_{gcs2}$ may be at a high level and selection switch $Q_{cs2}$ can be switched on. A waveform of voltage difference $V_{load2}$ between two ends of piezoelectric load $C_{load2}$ may be the same as the waveform of voltage difference $V_{load1}$ when piezoelectric load $C_{load1}$ is driven. In addition, the operation process of driving circuit when selection switch $Q_{cs2}$ is turned on may be the same as the operation process of driving circuit when selection switch $Q_{cs1}$ is turned on.

During time interval $t_{10}$-$t_{12}$, $V_{gcs1}$ and $V_{gcs2}$ may both be at a high level, such that the two voltage output circuits are all switched on to drive piezoelectric loads $C_{load1}$ and $C_{load2}$, respectively. At time $t_{13}$, $V_{gcs1}$ and $V_{gcs2}$ may both be at a low level, such that the two voltage output circuits are all switched off. Voltage difference $V_{load1}$ between two ends of piezoelectric load $C_{load1}$ may be equal to 0, and voltage difference $V_{load2}$ between two ends of piezoelectric load $C_{load2}$ can be equal to 0.

Figure 18:
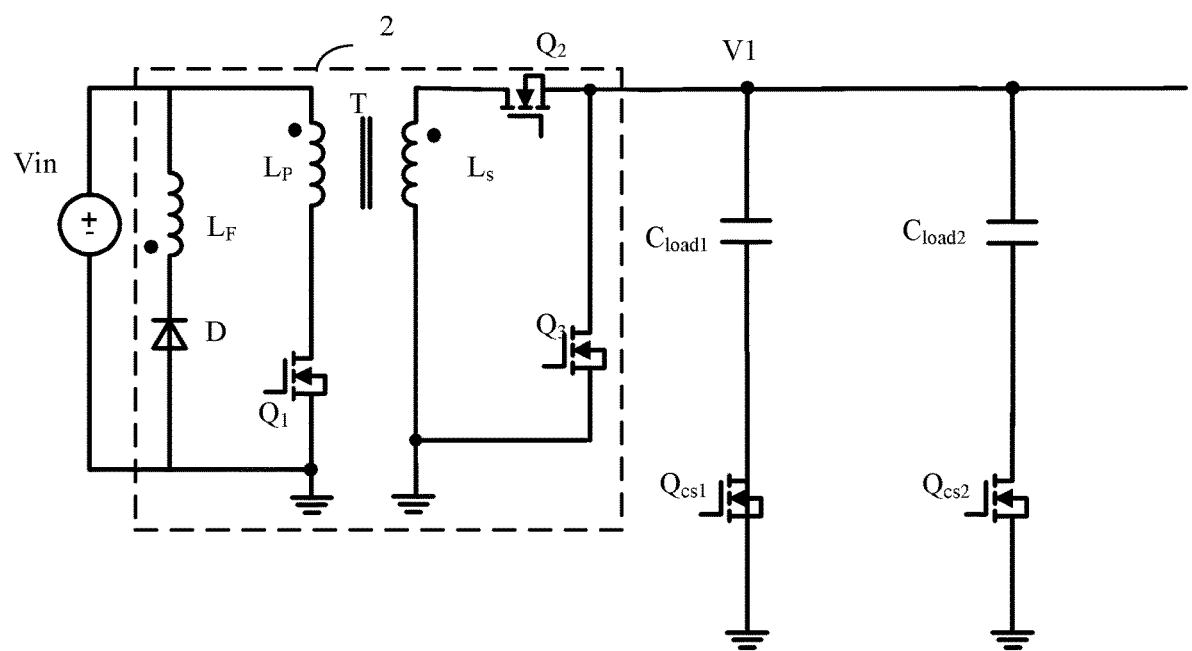
FIG. 18 is a schematic diagram of a sixth example driving circuit, in accordance with embodiments of the present invention.

Referring now to FIG. 18, shown is a schematic diagram of a sixth example driving circuit, in accordance with embodiments of the present invention. In this particular example driving circuit, power stage circuit 2 can be configured as a bidirectional forward converter. The bidirectional forward converter can include transformer T, switch $Q_1$, switch $Q_2$, switch $Q_3$, and diode D. Transformer T can include primary winding $L_p$, secondary winding $L_s$, and reset winding $L_F$. Primary winding $L_p$ and switch $Q_1$ can connect in series at output end of rechargeable power supply Vin, and reset winding $L_F$ and diode D can connect in series at output end of rechargeable power supply Vin. Secondary winding $L_s$ and switch $Q_2$ can connect in series at the second end of power stage circuit 2, and switch $Q_3$ can connect at the second end of power stage circuit 2. When piezoelectric load $C_{load1}$ or $C_{load2}$ is required to be driven, power supply voltage signal V1 may be generated at the second end of power stage circuit 2 to drive piezoelectric load $C_{load1}$ or $C_{load2}$.

Figure 19:
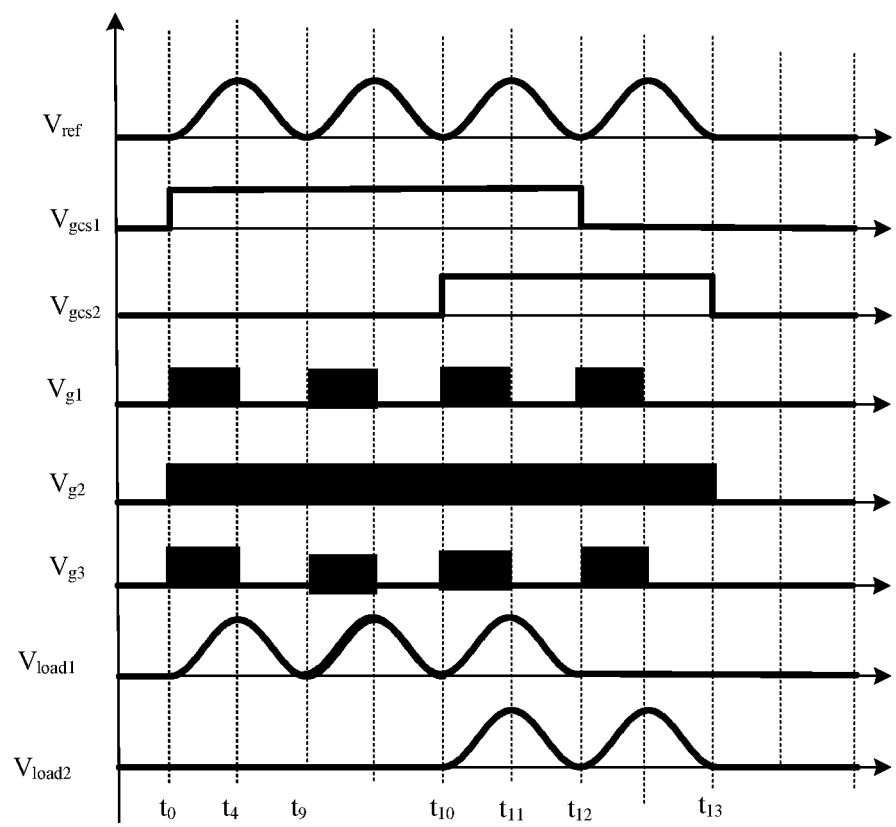
FIG. 19 is a waveform diagram of operation of the sixth example driving circuit, in accordance with embodiments of the present invention.

An operation process of the driving circuit according to this example is described below in conjunction with FIGS. 18 and 19. $V_{ref}$ represents the reference voltage, and a waveform of the reference voltage may be a sine wave with a trough value not less than zero. $V_{g1}$ may represent a driving signal for switch $Q_1$, $V_{g2}$ may represent a driving signal for switch $Q_2$, $V_{g3}$ may represent a driving signal for switch $Q_3$, $V_{gcs1}$ may represent a driving signal for selection switch $Q_{cs1}$, $V_{gcs2}$ may represent a driving signal for selection switch $Q_{cs2}$, $V_{load1}$ may represent a voltage difference between two ends of piezoelectric load $C_{load1}$1, and $V_{load2}$ may represent a voltage difference between two ends of piezoelectric load $C_{load2}$.

For driving piezoelectric load $C_{load1}$, at time $t_0$, $V_{gcs1}$ can be at a high level and selection switch $Q_{cs1}$ may be switched on. During time interval $t_0$-$t_4$, reference voltage $V_{ref}$ can increase, and power stage circuit 2 may operate in the forward direction. During time interval $t_0$-$t_4$, switches $Q_1$, $Q_2$, and $Q_3$ may operate in a PWM mode, and power stage circuit 2 can operate as a forward circuit. During this time interval, rechargeable power supply Vin can charge piezoelectric load $C_{load1}$ through power stage circuit 2, such that power supply voltage signal V1 increases with reference voltage $V_{ref}$ in this time interval. Voltage difference $V_{load1}$ between two ends of piezoelectric load $C_{load1}$ during this time interval may be as shown in FIG. 19.

During time interval $t_4$-$t_9$, reference voltage $V_{ref}$ can decrease, and power stage circuit 2 may operate in the reverse direction. During time interval $t_4$-$t_9$, switch $Q_2$ may operate in a PWM mode, switches $Q_1$ and $Q_3$ can be turned off, and power stage circuit 2 may operate as a flyback circuit. During this time interval, piezoelectric load $C_{load1}$ can charge rechargeable power supply Vin through power stage circuit 2. As such, piezoelectric load $C_{load1}$ can be discharged, such that power supply voltage signal V1 decreases with reference voltage $V_{ref}$ in this time interval. Voltage difference $V_{load1}$ between two ends of piezoelectric load $C_{load1}$ during this time interval is as shown in FIG. 19. Time interval $t_0$-$t_9$ is one operation period, and the operation process during time interval $t_0$-$t_9$ may be repeated, such that power supply voltage signal V1 changes with reference voltage $V_{ref}$, until time $t_{12}$. At time $t_{12}$, selection switch $Q_{cs1}$ can be turned off, such that piezoelectric load $C_{load1}$ is essentially disconnected from the driving circuit, and voltage difference $V_{load1}$ between two ends of piezoelectric load $C_{load1}$ can be equal to 0.

For driving piezoelectric load $C_{load2}$, during time interval $t_{10}$-$t_{13}$, $V_{gcs2}$ can be at a high level and selection switch $Q_{cs2}$ may be switched on. A waveform of the voltage difference $V_{load2}$ between two ends of the piezoelectric load $C_{load2}$ can be the same as the waveform of the voltage difference $V_{load1}$ when the piezoelectric load $C_{load1}$ is driven. In addition, the operation process of driving circuit when selection switch $Q_{cs2}$ is turned on may be the same as the operation process of driving circuit when selection switch $Q_{cs1}$ is turned on.

During time interval $t_{10}$-$t_{12}$, $V_{gcs1}$ and $V_{gcs2}$ may both be at a high level, such that the two voltage output circuits are all switched on to drive piezoelectric loads $C_{load1}$ and $C_{load2}$, respectively. At time $t_{13}$, $V_{gcs1}$ and $V_{gcs2}$ may both be at a low level, such that the two voltage output circuits are all switched off. Voltage difference $V_{load1}$ between two ends of piezoelectric load $C_{load1}$ can be equal to 0, and voltage difference $V_{load2}$ between two ends of piezoelectric load $C_{load2}$ may be equal to 0. In other examples, power stage circuit 2 can be a bidirectional buck-boost converter, a bidirectional Cuk converter, a bidirectional push-pull converter, or a bidirectional full-bridge converter, to mention a few.

A driving method can also be provided in certain embodiments, and may be based on a driving circuit. The driving circuit used to drive a piezoelectric load can include a rechargeable power supply and a power stage circuit, and the power stage circuit can be coupled between the rechargeable power supply and the piezoelectric load. The driving method can include: during a first operation interval of an operation period, the rechargeable power supply can charge the piezoelectric load through the power stage circuit, such that a power supply voltage signal provided to the piezoelectric load in the first operation interval corresponds to a reference voltage in a first interval; and during a second operation interval of the operation period, the piezoelectric load can charge the rechargeable power supply through the power stage circuit, such that the power supply voltage signal in the second operation interval corresponds to the reference voltage in a second interval.

Further, the operation states of power stage circuit 2 may be controlled such that the power supply voltage signal in the first operation interval corresponds to the reference voltage in the first interval. Also, the power supply voltage signal in the second operation interval corresponds to the reference voltage in the second interval. Further, during the first operation interval, the power stage circuit can be controlled to operate in a forward direction to charge the piezoelectric load. Further, during the second operation interval, the power stage circuit may be controlled to operate in a reverse direction to discharge the piezoelectric load. Further, when the reference voltage increases, the power stage circuit operates in the forward direction, and when the reference voltage decreases, the power stage circuit may operate in the reverse direction. In addition, the reference voltage in the first interval can be a rising part of the reference voltage within a period, and the reference voltage in the second interval can be a falling part of the reference voltage within the period. In one example, the waveform of the reference voltage can be a sine wave with a trough value not less than zero.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A driving circuit for driving a piezoelectric load, the driving circuit comprising:
   a) a rechargeable power supply;
   b) a power stage circuit coupled between the rechargeable power supply and the piezoelectric load;
   c) wherein during a first operation interval of an operation period, the rechargeable power supply charges the piezoelectric load through the power stage circuit, such that a power supply voltage signal provided to the piezoelectric load in the first operation interval corresponds to a reference voltage in a first interval; and
   d) wherein during a second operation interval of the operation period, the piezoelectric load charges the rechargeable power supply through the power stage circuit, such that the power supply voltage signal in the second operation interval corresponds to the reference voltage in a second interval.

2. The driving circuit of claim 1, wherein operation states of the power stage circuit are controlled to adjust the power supply voltage signal in the first operation interval to change with the reference voltage in the first interval, and to adjust the power supply voltage signal in the second operation interval to change with the reference voltage in the second interval.

3. The driving circuit of claim 1, wherein during the first operation interval, the power stage circuit is controlled to operate in a forward direction to charge the piezoelectric load.

4. The driving circuit of claim 1, wherein during the second operation interval, the power stage circuit is controlled to operate in a reverse direction to discharge the piezoelectric load.

5. The driving circuit of claim 1, wherein when the reference voltage increases, the power stage circuit operates in a forward direction, and when the reference voltage decreases, the power stage circuit operates in a reverse direction.

6. The driving circuit of claim 1, wherein the power stage circuit comprises a first switch and a second switch, and the power stage circuit is controlled to operate in a forward direction or in a reverse direction by controlling operation states of the first switch and the second switch.

7. The driving circuit of claim 1, wherein a waveform of the reference voltage is a sine wave with a trough value not less than zero.

8. The driving circuit of claim 1, wherein the reference voltage in the first interval is a rising part of the reference voltage within a period, and the reference voltage in the second interval is a falling part of the reference voltage within the period.

9. The driving circuit of claim 1, further comprising N voltage output circuits configured to drive N piezoelectric loads in one-to-one correspondence, wherein N is a positive integer, and wherein:
   a) the N voltage output circuits are connected in parallel with each other; and
   b) for each of the N voltage output circuits, the voltage output circuit comprises a selection switch, the selection switch is connected in series with the piezoelectric load driven by the voltage output circuit, and the voltage output circuit is switched on or off by controlling switching states of the selection switch.

10. The driving circuit of claim 6, further comprising a control circuit having a first control circuit and a second control circuit, wherein the first control circuit is configured to generate a first control signal to control switching states of the first switch, and the second control circuit is configured to generate a second control signal to control switching states of the second switch.

11. The driving circuit of claim 10, wherein during the first operation interval, the first control circuit generates the first control signal according to a compensation signal, and the second control circuit generates the second control signal according to a drain-source voltage of the second switch, wherein the compensation signal indicates a difference between the reference voltage and a sampling signal characterizing the power supply voltage signal.

12. The driving circuit of claim 10, wherein during the second operation interval, the first control circuit generates the first control signal according to a drain-source voltage of the first switch, and the second control circuit generates the second control signal according to a compensation signal, wherein the compensation signal indicates a difference between the reference voltage and a sampling signal characterizing the power supply voltage signal.

13. The driving circuit of claim 1, wherein the power stage circuit is configured as one of: a bidirectional boost-buck converter, a bidirectional buck-boost converter, a bidirectional Cuk converter, a bidirectional Zeta-Sepic converter, a bidirectional flyback converter, a bidirectional forward converter, a bidirectional push-pull converter, a bidirectional half-bridge converter, and a bidirectional full-bridge converter.

14. The driving circuit of claim 6, wherein the power stage circuit further comprises a transformer comprising a primary winding and a secondary winding, wherein the primary winding and the first switch are connected in series at a first end of the power stage circuit, and the secondary winding and the second switch are connected in series at a second end of the power stage circuit.

15. The driving circuit of claim 6, wherein the power stage circuit further comprises an inductor, wherein the inductor and the first switch are connected in series at a first end of the power stage circuit, one terminal of the second switch is coupled to a common end of the inductor and the first switch, and the other terminal of the second switch is configured as a high potential end of a second end of the power stage circuit.

16. A driving method for a driving circuit comprising a rechargeable power supply and a power stage circuit coupled between the rechargeable power supply and a piezoelectric load, the method comprising:
   a) during a first operation interval of an operation period, charging by the rechargeable power supply, the piezoelectric load through the power stage circuit, such that a power supply voltage signal provided to the piezoelectric load in the first operation interval corresponds to a reference voltage in a first interval; and
   b) during a second operation interval of the operation period, charging by the piezoelectric load, the rechargeable power supply through the power stage circuit, such that the power supply voltage signal in the second operation interval corresponds to the reference voltage in a second interval.

17. The method of claim 16, wherein operation states of the power stage circuit are controlled to adjust the power supply voltage signal in the first operation interval to change with the reference voltage in the first interval, and to adjust the power supply voltage signal in the second operation interval to change with the reference voltage in the second interval.

18. The method of claim 16, wherein during the first operation interval, the power stage circuit is controlled to operate in a forward direction to charge the piezoelectric load; and during the second operation interval, the power stage circuit is controlled to operate in a reverse direction to discharge the piezoelectric load.

19. The method of claim 16, wherein when the reference voltage increases, the power stage circuit operates in a forward direction, and when the reference voltage decreases, the power stage circuit operates in a reverse direction.

20. The method of claim 16, wherein the reference voltage in the first interval is a rising part of the reference voltage within a period, and the reference voltage in the second interval is a falling part of the reference voltage within the period.

* * * * *